(12) United States Patent
Chen et al.

(10) Patent No.: US 11,475,954 B2
(45) Date of Patent: Oct. 18, 2022

(54) FAST INTERVAL READ SETUP FOR 3D NAND FLASH

(71) Applicant: MACRONIX INTERNATIONAL CO., LTD., Hsinchu (TW)

(72) Inventors: Han-Sung Chen, Hsinchu (TW); Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/153,525

(22) Filed: Jan. 20, 2021

(65) Prior Publication Data
US 2022/0157379 A1     May 19, 2022

Related U.S. Application Data

(60) Provisional application No. 63/113,959, filed on Nov. 15, 2020.

(51) Int. Cl.
    *G11C 16/04*          (2006.01)
    *G11C 16/26*          (2006.01)
    (Continued)

(52) U.S. Cl.
    CPC .......... *G11C 16/0483* (2013.01); *G11C 16/08* (2013.01); *G11C 16/107* (2013.01);
    (Continued)

(58) Field of Classification Search
    CPC ... G11C 16/0483; G11C 16/08; G11C 16/107; G11C 16/24; G11C 16/26; G11C 16/30
    (Continued)

(56) References Cited

U.S. PATENT DOCUMENTS

| | | |
|---|---|---|
| 9,230,665 B2 | 1/2016 | Hosono |
| 10,211,218 B2 | 2/2019 | Lue |

(Continued)

FOREIGN PATENT DOCUMENTS

TW      202038232 A      10/2020

OTHER PUBLICATIONS

Spinelli, et al., "Reliability of NAND Flash Memories: Planar Cells and Emerging Issues in 3D Devices," Computers. 2017; 6(2), Apr. 21, 2017, 55 pages.

(Continued)

*Primary Examiner* — Tha-O H Bui
(74) *Attorney, Agent, or Firm* — Andrew L. Dunlap; Haynes Beffel & Wolfeld LLP

(57) ABSTRACT

A memory having a plurality of blocks is coupled with control circuits having logic to execute a read setup operation, the read setup operation comprising simultaneously applying a read setup bias to a plurality of memory cells of a selected block of the plurality of blocks. Logic to traverse the blocks in the plurality of blocks can apply the read setup operation to the plurality of blocks. The blocks in the plurality of blocks can include respectively a plurality of sub-blocks, The read setup operation can traverse sub-blocks in a block to simultaneously apply the read setup bias to more than one individual sub-block of the selected block. A block status table can be used to identify stale blocks for the read setup operation. Also, the blocks can be traversed as a background operation independent of read commands addressing the blocks.

16 Claims, 15 Drawing Sheets

(51) Int. Cl.
  *G11C 16/08* (2006.01)
  *G11C 16/30* (2006.01)
  *G11C 16/24* (2006.01)
  *G11C 16/10* (2006.01)
(52) U.S. Cl.
  CPC .............. *G11C 16/24* (2013.01); *G11C 16/26* (2013.01); *G11C 16/30* (2013.01)
(58) Field of Classification Search
  USPC .................................................. 365/185.17
  See application file for complete search history.

(56) References Cited

U.S. PATENT DOCUMENTS

| | | | |
|---|---|---|---|
| 10,360,101 | B2 | 7/2019 | Kodama et al. |
| 10,521,287 | B2 | 12/2019 | Khoueir et al. |
| 11,270,776 | B1 | 3/2022 | Lien et al. |
| 2002/0039311 | A1* | 4/2002 | Takeuchi ............... G11C 16/20 365/185.09 |
| 2005/0146959 | A1* | 7/2005 | Shiga ..................... G11C 16/26 714/E11.038 |
| 2014/0016413 | A1 | 1/2014 | Han et al. |
| 2016/0179402 | A1 | 6/2016 | Iwashiro et al. |
| 2016/0205054 | A1 | 7/2016 | Lu et al. |
| 2017/0185299 | A1 | 6/2017 | Conley et al. |
| 2020/0012598 | A1 | 1/2020 | Feng et al. |
| 2020/0226080 | A1 | 7/2020 | Tarango et al. |
| 2021/0366561 | A1 | 11/2021 | Senoo |
| 2022/0028460 | A1 | 1/2022 | Kurose et al. |

OTHER PUBLICATIONS

Zambelli, et al., "First Evidence of Temporary Read Errors in TLC 3D-NAND Flash Memories exiting from an Idle State," IEEE J. of the Electron Devices Society, vol. 8, Jan. 10, 2020, 6 pages.

U.S. Office Action in U.S. Appl. No. 17/234,236 dated Apr. 19, 2022, 16 pages.

* cited by examiner

FAST INTERVAL READ SETUP FOR 3D NAND FLASH

PRIORITY APPLICATION

This application claims the benefit of U.S. Provisional Patent Application No. 63/113,959 filed 15 Nov. 2020, which application is incorporated herein by reference.

BACKGROUND

Field

The present invention relates to integrated circuit memory, including nonvolatile NAND memory, and methods for operating the same.

Description of Related Art

In high density memory, such as 3D NAND memory, the channel of memory cell transistors can have different resistivities before and after stress. For example, thin film polysilicon used in the vertical channel structures of 3D NAND memory can suffer changes in resistivity over time. The different resistances that arise because of this characteristic can cause the threshold voltages to shift by for example 10 to 30 milliVolts, which in turn can reduce the operating windows for the memory.

It is desirable to provide technologies than can improve the operating window for memory in these conditions.

SUMMARY

A memory is described comprising a memory array having a plurality of blocks, wherein blocks in the plurality of blocks are arranged to be activated for memory operations in response to corresponding groups of word lines. Control circuits are part of or coupled to the memory, and comprise logic to execute a read setup operation, the read setup operation comprising simultaneously applying a read setup bias to a plurality of memory cells of a selected block of the plurality of blocks. Logic to traverse the blocks in the plurality of blocks is described, to apply the read setup operation to the plurality of blocks. The blocks in the plurality of blocks can include, respectively, a plurality of sub-blocks, wherein sub-blocks in the plurality of sub-blocks are arranged to be activated for connection to the set of global bit lines for memory operations in response to corresponding sub-block string select lines, and a sub-block comprises a plurality of NAND strings. The read setup operation can include traversing the sub-blocks in the selected block, to simultaneously apply the read setup bias to respective pluralities of memory cells of individual sub-blocks of the selected block, including embodiments in which more than one NAND string connected to a single global bit line receives the setup bias simultaneously. For the purposes of this description, "simultaneously" means that the biasing arrangements overlap in time, at least partially, so that all simultaneous biasing arrangements consume current to increase combined current consumption for the memory array.

Embodiments can include maintaining a block status table identifying stale blocks, and the read setup operation can be applied to stale blocks identified in the block status table. Alternatively, the blocks in the array can be traversed sequentially, or in a systematic order, as a background operation or otherwise independent of read commands addressing the blocks, to maintain readiness of the memory cells for subsequent read operations.

A method of operating a memory is described, where the memory can comprise a memory plane, the memory plane including said plurality of blocks of memory cells and a plurality of bit lines, each block including a set of NAND strings having string select gates for connection to corresponding bit lines in the plurality of bit lines, and in which each NAND string in the set of NAND strings of the block is connected to a group of word lines for the block. The method comprises traversing the plurality of blocks to apply read setup bias arrangements to stale blocks in the plurality of blocks which condition the stale blocks for read operations. The read setup bias arrangements include simultaneously applying a read setup bias to a plurality of memory cells of a selected block of the plurality of blocks. The method can be deployed in a memory in which each block in the plurality of blocks of memory cells has a plurality of sub-blocks, each sub-block including a distinct subset of the set of NAND strings of the block, the distinct subset of NAND strings in each sub-block being operatively connected to a respective sub-block string select line by which gate voltages are applied to the string select gates of the NAND strings in the distinct subset of the sub-block. The read setup bias operations can be applied to more than one sub-block in a single block simultaneously.

Other aspects and advantages of the present invention can be seen on review of the drawings, the detailed description and the claims, which follow.

DETAILED DESCRIPTION

A detailed description of embodiments of the present invention is provided with reference to the FIGS. 1-15.

Figure 1:
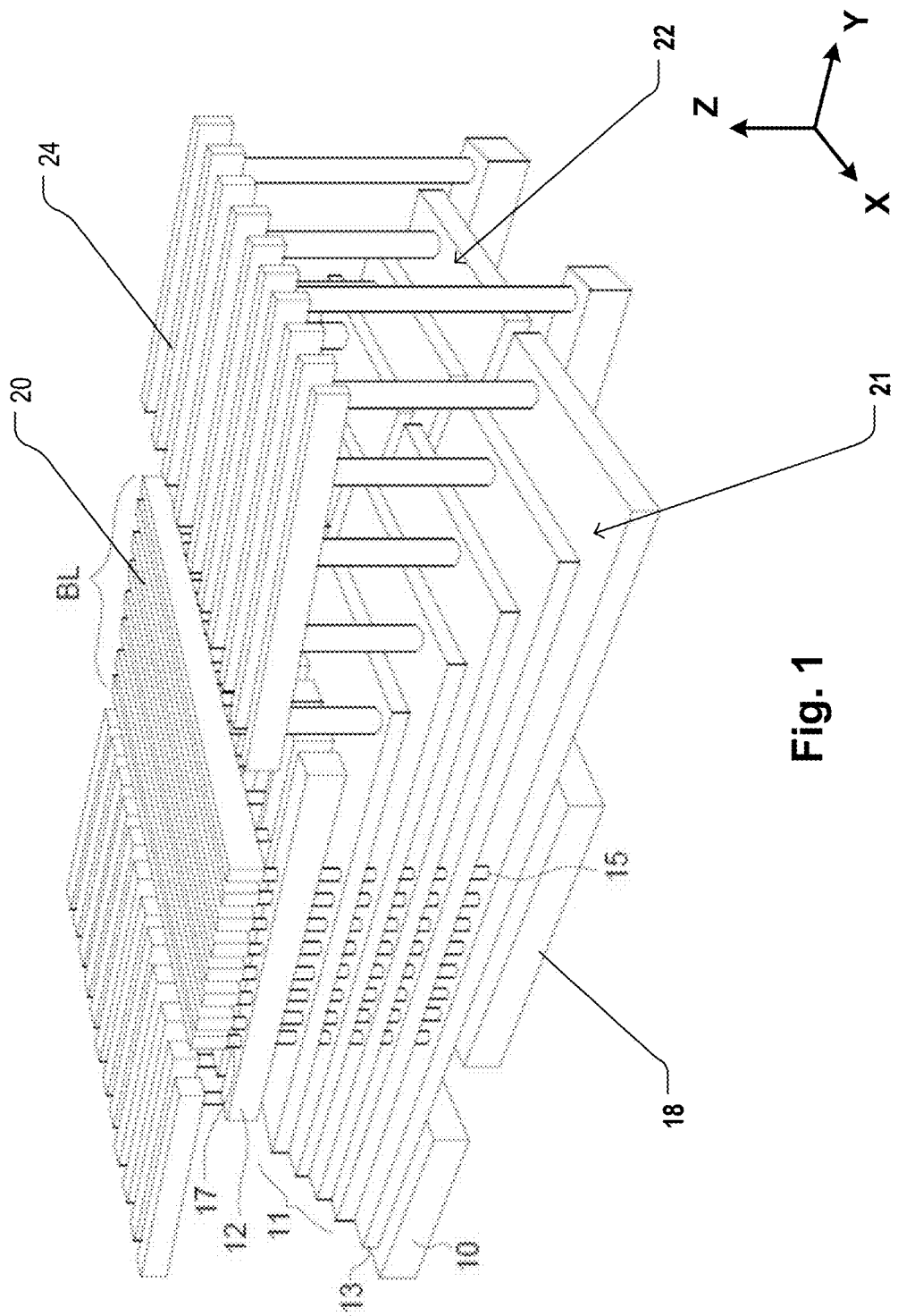
FIG. 1 is a perspective view of a 3D vertical NAND structure, having a block and sub-block architecture.

FIG. 1 is a perspective view of a 3D semiconductor device including a plurality of blocks and sub-blocks of memory cells in a plurality of vertical NAND strings. It comprises a multilevel stack of word line layers 11 configured as a first stack 21 of word line layers and a second stack 22 of word line layers, each parallel to the substrate 10, and a plurality of pillars 15 oriented orthogonally to the substrate in the Z direction as labeled in this figure extending through corresponding stacks of word line layers. The pillars comprise respective semiconductor bodies providing channels, which can be thin film channels less than 10 nm thick, of a plurality of series-connected memory cells located at cross-points between the pillars and the word lines in a NAND string configuration. A plurality of string select lines (SSLs) 12 is oriented parallel to the substrate in the Y direction, as labeled in this figure, and above the word line layers 11. In this example, first and second blocks of memory cells are formed in the first stack 21 and in the second stack 22, respectively, each coupled to different sets of NAND strings. Each of the string select lines intersects a respective distinct subset (e.g. one or more rows) of the set of pillars in a corresponding block, where each sub-block of memory cells in the corresponding block is formed in a subset of pillars coupled to a respective string select line.

The structure also includes a plurality of parallel global bit line conductors 20 in a layer parallel to the substrate extending in the X direction as labeled in this figure, and above the string select lines. Each of the global bit line conductors superposes a respective column of the pillars in the array across multiple blocks, each column including one pillar in each subset of pillars for each string select line.

Each intersection of a pillar and a string select line defines a select gate of the pillar for connection to a corresponding bit line. Each of the pillars underlies and is coupled by the select gate of the pillar to one of the bit line conductors.

Lower select lines (lower SG) 13 are formed under the word line layers 11 to couple the pillars to one or more source lines such as a common source conductor 18. The common source conductor can be connected to bias circuitry by vertical connections between the blocks, or otherwise.

The structure of FIG. 1 is one example of a memory including a plurality of blocks of memory cells and a plurality of bit lines, each block including a group of word lines (i.e. a stack in FIG. 1), and a set of NAND strings having string select gates for connection to corresponding bit lines in the plurality of bit lines, and in which each NAND string in the set of NAND strings of the block is connected to the group of word lines. Also, it is an example of a memory in which each block in the plurality of blocks of memory cells has a plurality of sub-blocks, each sub-block including a distinct subset of the set of NAND strings of the block. Also, in this example, the distinct subset of NAND strings in each sub-block is operatively connected to a respective sub-block string select line by which gate voltages are applied to the string select gates of the NAND strings in the distinct subset of the sub-block.

In structures like that illustrated in FIG. 1, an operation can be applied to limit the impact of the changing resistivities of channel semiconductor materials over time. For example, in some memory architectures when programming the memory cells, the channel polysilicon is stressed so that the thresholds set by the program are based on the stressed condition resistivities. To address this issue, a stress read bias can be applied to stress memory cells to be read. After the stress read, the channel can maintain the stressed condition for an interval of time, such as 10 minutes or so. So, the cell may be read within that interval without requiring another stress read bias.

Figure 2:
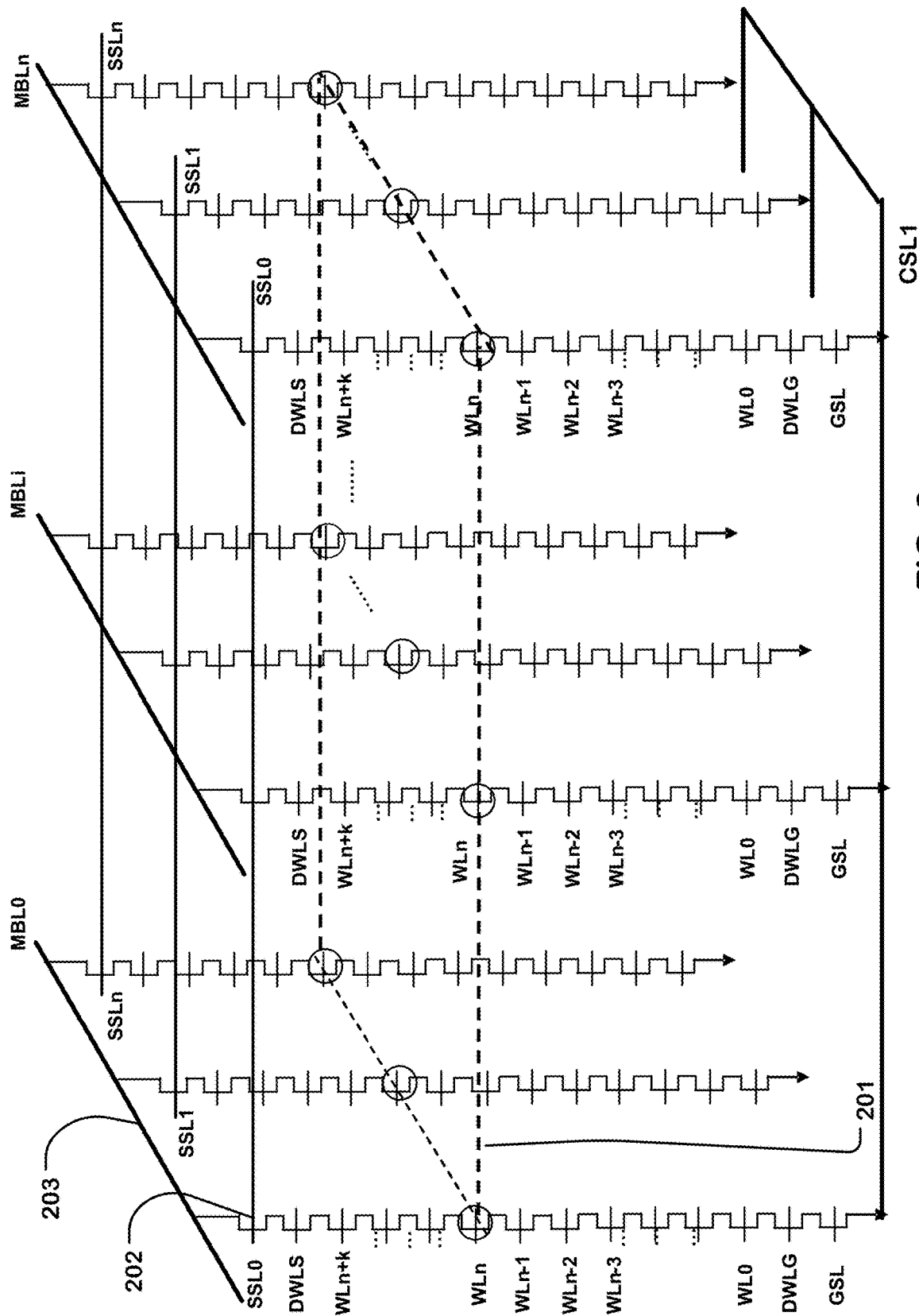
FIG. 2 is a circuit schematic diagram of a block of NAND flash memory cells, which can be implemented using an architecture like that of FIG. 1.

FIG. 2 is a schematic diagram of a block of memory cells in a 3D NAND device which can comprise many blocks, and in which a block includes a plurality of sub-blocks. In the schematic, a plurality of global bit lines MBL0 to MBLn overlies an array of NAND strings arranged in rows and columns. Each of the NAND strings comprises a series-connected string of memory cells, such as dielectric charge trapping memory cells, between a corresponding bit line and a reference line such as the common source line CSL. In some embodiments, the common source line for a block can be implemented as one or more reference lines, and may be coupled to biasing circuitry by which operating voltages are applied in various operations of the memory.

In a 3D NAND arrangement, the set of NAND strings of the block shown in FIG. 2 correspond with pillars of FIG. 1, for example. The NAND strings of the plurality of NAND strings are coupled with a corresponding stack of word lines WL0 to WLn+k, in which each word line is coupled to memory cells at its layer, in all the NAND strings in the block, in this example. At word line WLn, the planar structure of each of the word line layers is represented by the dashed line 201. Thus, all the memory cells in the block at the level of a given word line, such as WLn, in the block are coupled to that given word line, such as WLn, so that they can be activated by voltages applied to the given word line.

Also, each of the NAND strings includes a corresponding sub-block string select gate (e.g. 202) configured to connect the NAND string to a particular bit line (e.g. 203) in the plurality of bit lines.

A plurality of sub-block string select lines SSL0 to SSLn are operatively coupled to the string select gates of respective distinct subsets of NAND strings, where each subset of NAND strings includes a sub-block of the block of memory cells, to apply gate voltages to the sub-block string select gates.

Also, each of the NAND strings includes a corresponding lower select gate configured to connect the NAND string to the common source line or one of the one or more reference lines used to implement the common source line. A lower select gate layer GSL is coupled to all the lower select gates for the NAND strings in the block in this example. In another example, there can be a plurality of lower select gate lines arranged for connection to the lower select gates in the block.

In this example, a lower dummy word line DWLG lies between the lower select gate layer GSL and the lowest word line layer WL0, and an upper dummy word layer DWLS lies between the string select lines SSL0 to SSLn and the uppermost word line layer WLn+k.

In the circuit of FIG. 2, in order to select a particular memory cell in the block, a sub-block is activated by a sub-block string select line which connects each NAND string in the selected sub-block to a respective bit line in the plurality of bit lines, and a word line layer is selected which selects one memory cell at the level of the selected word line on each NAND string in the selected sub-block. The selected memory cell is activated by selecting one bit line corresponding to the NAND string in which the selected memory cell is located. This arrangement enables activation of a plurality of memory cells in parallel, one in each of the NAND strings of the selected sub-block, via its corresponding bit line and word line layer.

"Activate", as used herein, means to apply a particular bias so as to give effect to the connected cells or switches. The bias may be high or low, depending on the operation and the memory design. For the purposes of this description, the term "charging" refers to both driving the node to a higher voltage and driving the node to a lower voltage, including ground and negative voltages in some embodiments.

A NAND block as described herein can be implemented using a 3D NAND memory technology. Implementations can also be made using 2D NAND technology, in which the NAND block is logically defined across the plurality of 2D NAND arrays.

Figure 3:
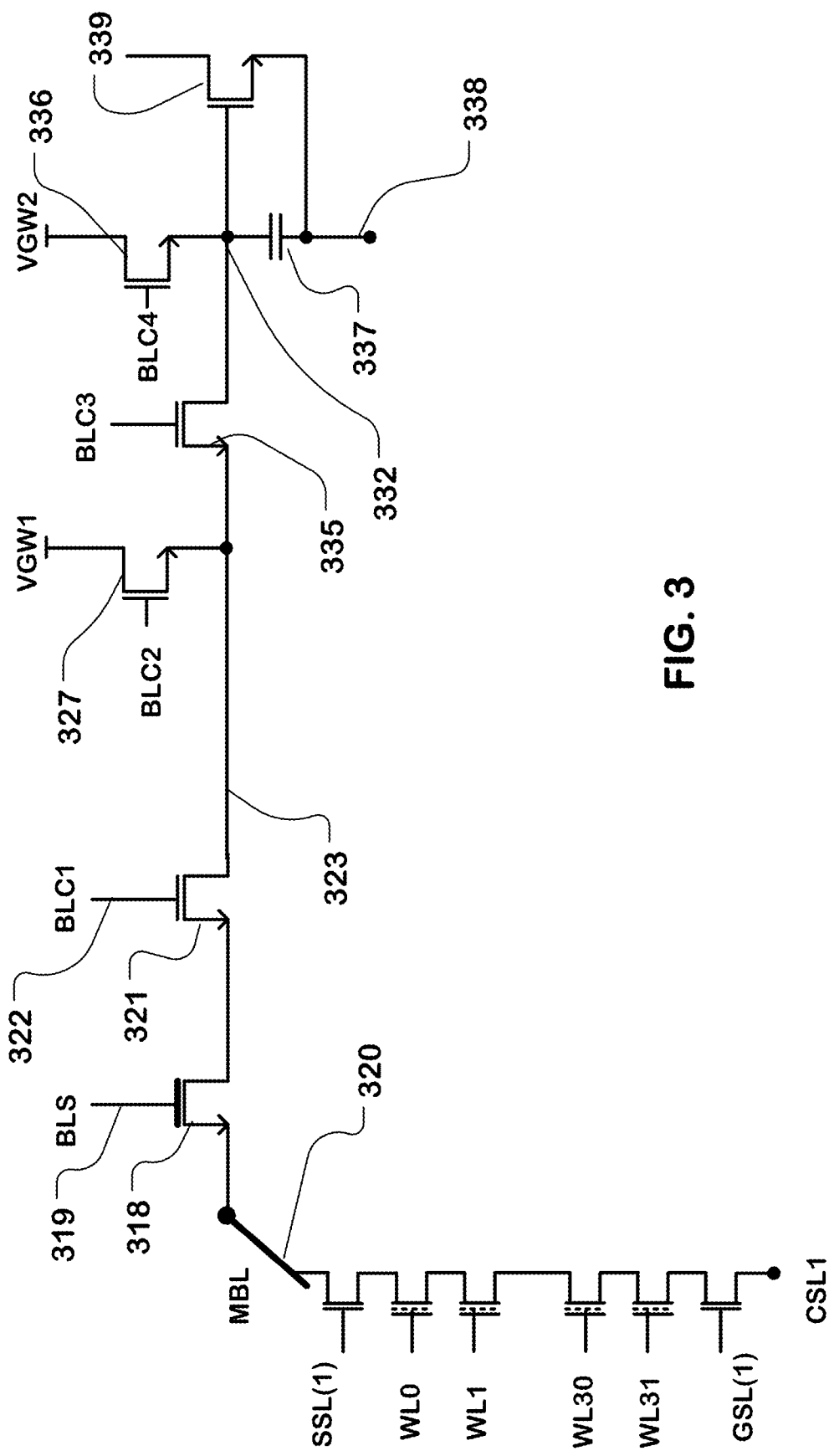
FIG. 3 is a simplified schematic diagram of a sense amplifier and bit line bias circuit usable in a device as described herein.

FIG. 3 illustrates the structure of a sense amplifier and bit line bias circuit which can be used to apply bias voltages to each bit line in the plurality of bit lines. A page buffer can include one sense amplifier and bit line bias circuit each bit line coupled to a selected block of the array.

The circuit in FIG. 3 is connected to a global bit line 320. A bit line select transistor 318 has a first source/drain terminal connected to the global bit line 320 and a second source/drain terminal. A gate of the bit line select transistor 318 is connected to a control signal BLS on line 319. A bit line clamp transistor 321 has a first source/drain terminal connected to the second source/drain terminal of transistor 318, and a second source/drain terminal connected to connecting node 323. The bit line clamp transistor 321 has its gate connected to the BLC1 line 322 at which bias voltages are applied by circuits not shown to control the voltage level of the MBL during precharge operations and other operations. A transistor 327 is provided for connecting node 323 to BLC2 line at which bias voltages are applied by circuits not shown. A pass transistor 335 is connected between connecting node 323 and a sensing node 332.

The pass transistor 335 is controlled by a control signal BLC3, which controls connection and disconnection of the connecting node 323 to the sensing node 332. A transistor 336 is connected between the sensing node 332 and a bias voltage VGW2, and is controlled by signal BLC4. A capacitor 337 (capacitance) is coupled from sensing node 332 to a sense signal node 338. A sensing transistor 339 has a gate connected to the sensing node 332, a first current carrying terminal connected to the sense pulse node 338 and a second current carrying terminal providing a sense amplifier output, which can be connected to latches of a page buffer.

During read operations and other operations, the transistors 318, 327 and 321 can be operated to set a bias voltage level on the selected bit lines as suits a particular operation.

Figure 4:
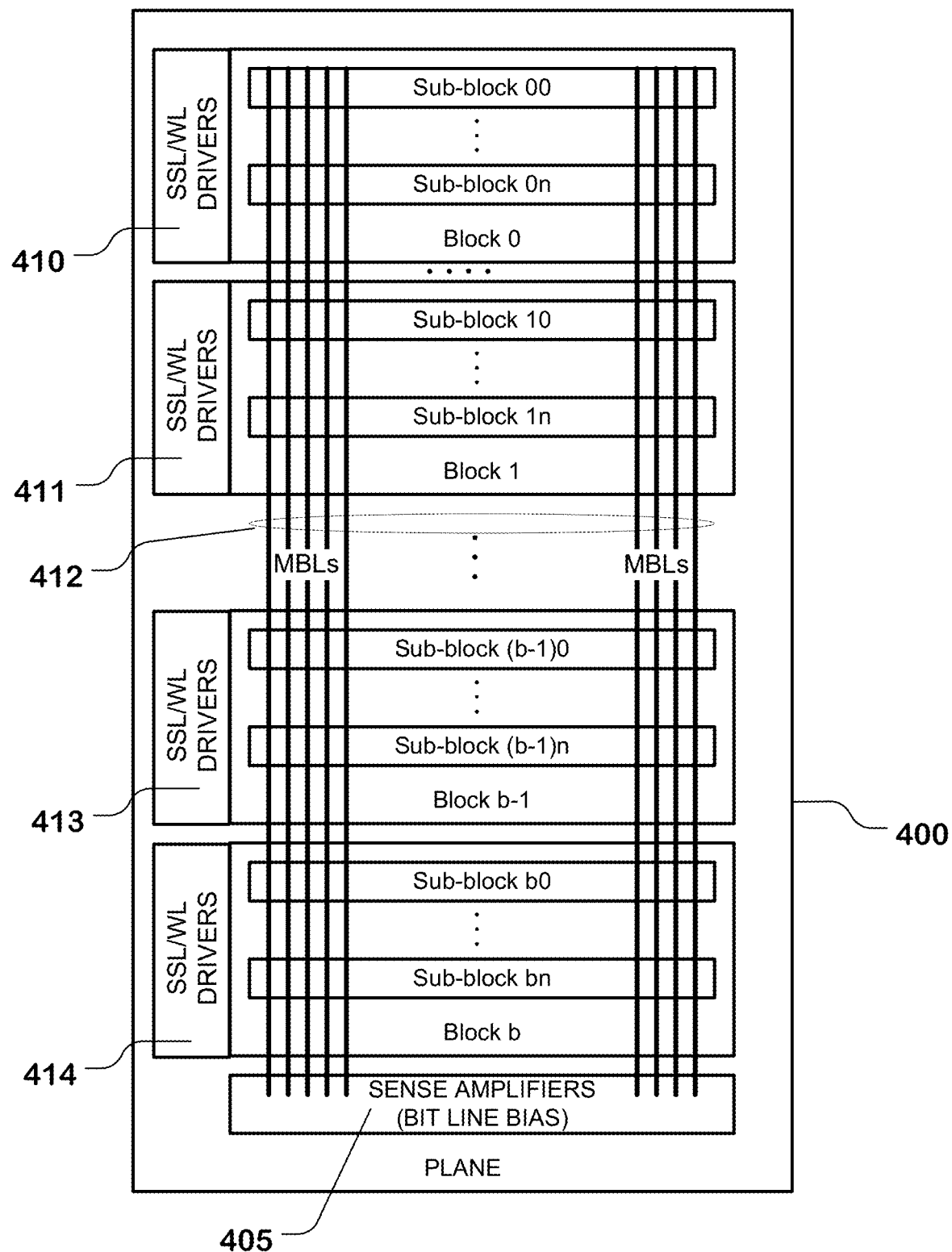
FIG. 4 is a block diagram of a segmentation of a memory plane according to embodiments described herein.
Figure 5:
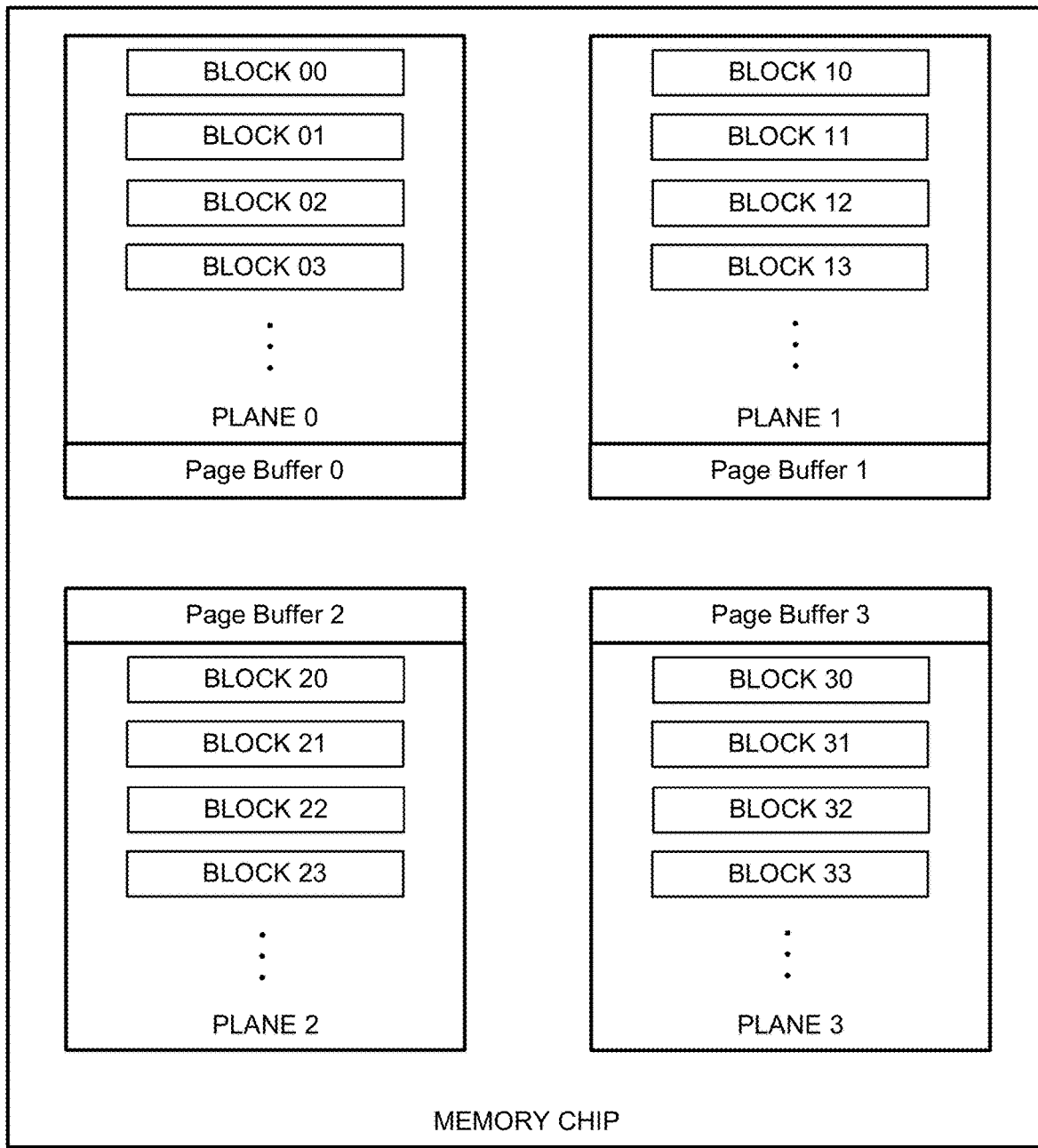
FIG. 5 is a block diagram of a segmentation of a memory array including multiple planes, according to embodiments described herein.

FIGS. 4 and 5 illustrate segmentation of a memory array on a memory device on a plane, block and sub-block levels according to one example to which the technology described herein can be applied. The technology described includes applying read setup operations that comprise applying bias voltages simultaneously to a plurality of memory cells to condition the plurality of memory cells for a subsequent read operation. The conditioning can condition the memory cell so that the threshold voltages match or are close to the threshold voltages established during a program operation as mentioned above.

FIG. 4 illustrates a configuration of a single plane 400 in a memory array. The plane 400 includes a plurality of blocks, Block 0, Block 1, . . . Block (b−1) and Block(b). Each of the blocks includes a plurality of sub-blocks. Thus, block 0 includes sub-block 00 to sub-block 0n, block 1 includes sub-block 10 to sub-block 1n, Block (b−1) includes sub-block (b−1)0 two sub-block (b−1)n and Block b includes sub-block (b)0 two sub-block (b)n.

A plurality of global bit lines 412 (MBLs) superimposes, and is shared by, all of the blocks in the plane. A set of sense amplifiers and bit line bias circuits 405 (e.g. FIG. 3) which can be part of page buffer circuits, is coupled to the plurality of global bit lines 412, by which bias voltages can be applied to the global bit lines 412 in support of the read setup operations. The set of sense amplifiers and bit line bias circuits 405 is shared by all of the blocks in the plane. Each of the blocks includes corresponding string select line SSL and word line WL drivers 410, 411, 413, 414, by which bias voltages can be applied in support of the read setup operations. Also, a common source line driver can be applied to each of the blocks.

A read setup operation can be applied to only one block at a time in a given plane in some embodiments. In other embodiments, a read setup operation can be applied to multiple blocks simultaneously in a given plane. In other embodiments, the read setup operation for a block having a number "n" of sub-blocks, can be applied more than one and fewer than "n" sub-blocks simultaneously. In other embodiments, the read setup operation can be applied to one or more sub-blocks in one block and one or more sub-blocks in another block of the plane simultaneously.

FIG. 5 illustrates a memory 500 including multiple planes, Plane 0, Plane 1, Plane 2 and Plane 3 in this example. Each of the planes includes a distinct page buffer circuits, including Page Buffer 0, Page Buffer 1, Page Buffer 2, Page Buffer 3. The Page Buffers are coupled to input/output circuitry not shown, supporting high throughput memory operations on the multiple planes. As illustrated, each of the planes includes a plurality of blocks. Plane 0 includes Block 00, Block 01, Block 02, Block 03, . . . . Plane 1 includes Block 10, Block 11, Block 12, Block 13, . . . . Plane 2 includes Block 20, Block 21, Block 22, Block 23, . . . . Plane 3 includes Block 30, Block 31, Block 32, Block 33, . . . .

A read setup operation can be applied to one block or multiple blocks in a single plane as discussed with reference to FIG. 5. Also, a read setup operation can be applied to one block or multiple blocks in one plane, and one block or multiple blocks in another plane simultaneously in some embodiments. Also, a read setup operation can be applied to one or more sub-blocks in one block of one plane, and one or more sub-blocks in one block of another plane simultaneously. Also, read setup operations can be applied to other read setup units, other than sub-block, block and plane units as suits a particular memory configuration.

FIG. 6 through FIG. 11 illustrate alternative embodiments of read setup bias arrangements to be applied in read setup operations as described herein to a plurality of memory cells in parallel, simultaneously. The bias arrangements applied during a read setup operation can be determined based on the memory structure of the memory array, by trial and error or by simulation. In general, the bias arrangements applied during read setup operations should be set so as to prevent disturbing charge stored in the memory cells by amounts that could cause loss of data. In general, such bias arrangements will have voltages on the order of those applied during normal read operations.

In all of FIG. 6 through FIG. 11, referring to the schematic diagrams of FIG. 2 and FIG. 3, timing diagrams for voltages applied on the global bit lines MBLs (VEL), the string select lines SSLs ($V_{SSL}$), the word lines WLs ($V_{WL}$), the lower select gate lines GSLs ($V_{GSL}$) and the common source line CSL ($V_{CSL}$) of a selected block are illustrated. The voltage on the global bit lines MBLs ($V_{MBL}$) can be controlled in response to the control signals VBL ($V_{VBL}$), BCL1 ($V_{BCL1}$) and BCL2 ($V_{BCL2}$) as mentioned above.

Figure 6:
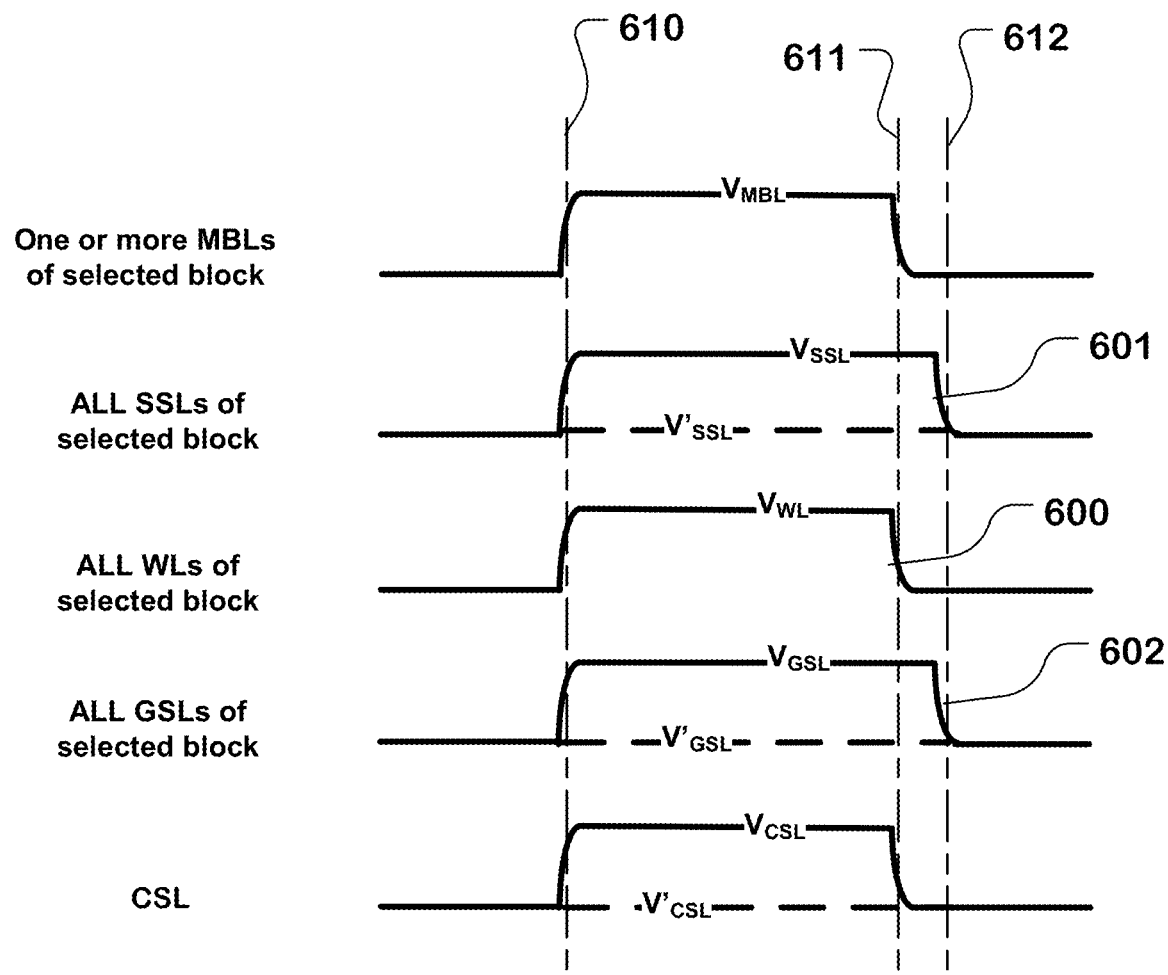
FIG. 6 is a timing diagram of read setup bias arrangements for embodiments described herein.

In the example illustrated in FIG. 6, all of the bias voltages are raised from ground to respective read setup bias levels (not shown to scale) at about the same time (610). The voltage pulses applied on the global bit lines MBLs ($V_{MBL}$), the word lines WLs ($V_{WL}$), and the common source line CSL ($V_{CSL}$), terminate at time 611. The voltage pulses applied on the string select lines SSLs ($V_{SSL}$) and the lower select gate lines GSLs ($V_{GSL}$) terminate shortly thereafter at time 612. Thus, the falling edge 600 of the voltage on the word lines WLs ($V_{WL}$) precedes the falling edges 601 and 602 of the voltages on the string select lines SSLs ($V_{SSL}$) and the lower select gate lines GSLs ($V_{GSL}$), which are aligned.

In this example, $V_{SSL}$ and $V_{GSL}$ are set at levels to turn on the string select gates, enabling current flow between the global bit lines and the common source lines. In other embodiments, the levels are set at $V'_{SSL}$ and $V'_{GSL}$ to turn off the string select gates. In some embodiments, one of the $V_{SSL}$ and $V_{GSL}$ voltages are set to turn on the string select gates while the other of the $V_{SSL}$ and $V_{GSL}$ are set at levels to turn off the string select gates, and only WL voltages are applied to stress the channels during the read setup operation. Also, in some embodiments, the common source line can be set to $V'_{CSL}$, which can be ground or another low reference voltage, to establish a voltage drop across the responding NAND strings to encourage or discourage current flow through the channels during the read setup operation.

Also, in some embodiments, the voltage pulses applied may not start at the same time (need not all start at time 610).

Figure 7:
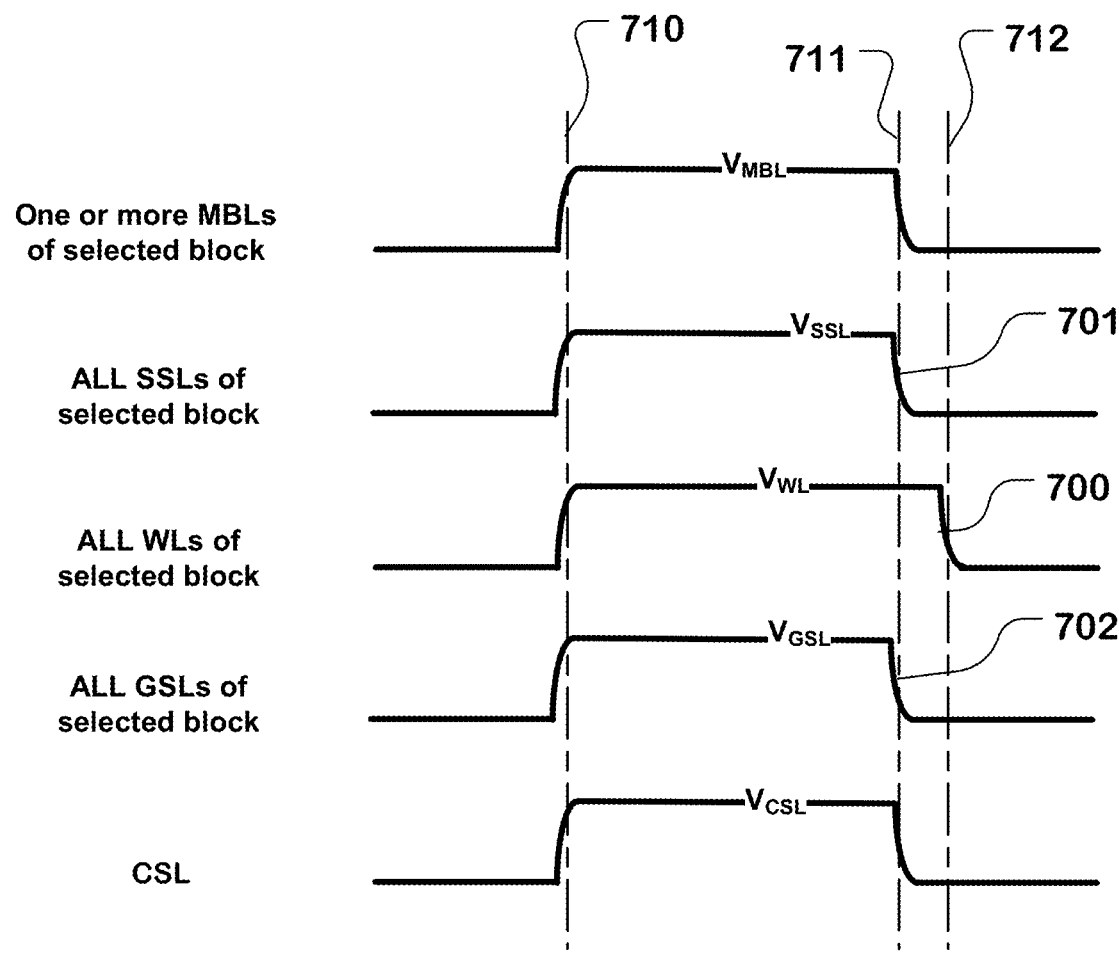
FIG. 7 is a timing diagram of variations of read setup bias arrangements for embodiments described herein.

FIG. 7 illustrates a biasing arrangement for the same signals as FIG. 6 in an alternative embodiment of a read setup operation. In the embodiment of FIG. 7, the same bias voltages can be applied as discussed above. All of the bias voltages are raised from ground to the read setup bias level at about the same time (710). However, in this embodiment, the voltage pulses applied on the global bit lines MBLs ($V_{MBL}$), the string select lines SSLs ($V_{SSL}$), the lower select gate lines GSLs ($V_{GSL}$) and the common source line CSL ($V_{CSL}$), terminate at time 711. The voltage pulses applied on the word lines WLs ($V_{WL}$), terminate shortly thereafter at time 712. Thus, the falling edge 700 of the voltage on the word lines WLs ($V_{WL}$) occurs after the falling edges 701 and 702 of the voltages on the string select lines SSLs ($V_{SSL}$) and the lower select gate lines GSLs ($V_{GSL}$), which are aligned.

Figure 8:
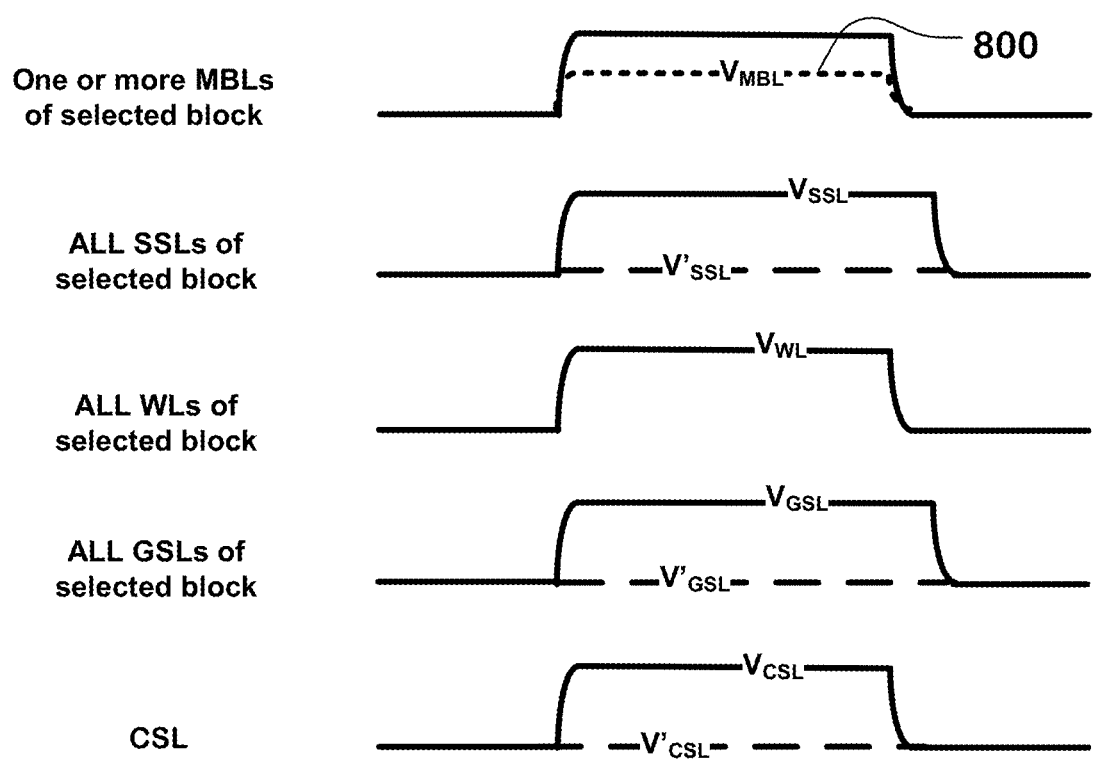
FIG. 8 is a timing diagram of more variations of read setup bias arrangements for embodiments described herein.

FIG. 8 is a timing chart like FIG. 6. FIG. 8 differs from the bias arrangement of FIG. 6, in that the voltage (800) applied on the bit lines MBLs ($V_{MBL}$) is reduced below the voltage applied during precharge for a read operation on a NAND string, so that the current generated during the read setup operation can be reduced relative to average read current.

Figure 9:
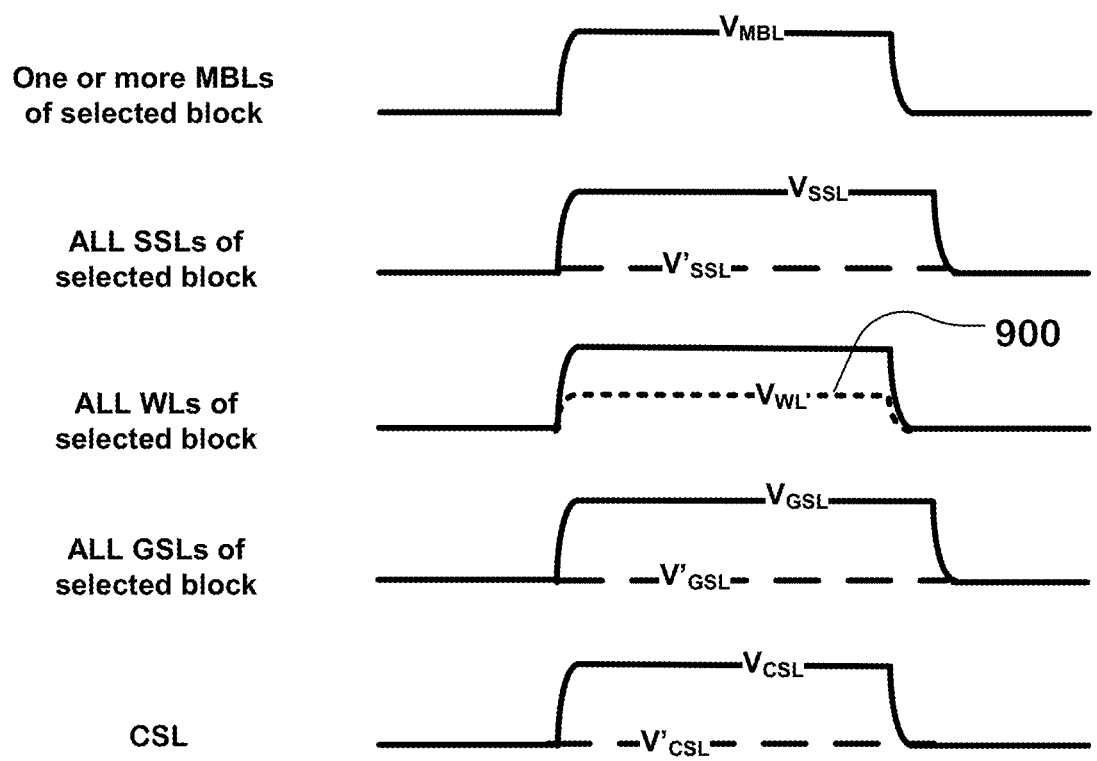
FIG. 9 is a timing diagram of alternative read setup bias arrangements for embodiments described herein.

FIG. 9 is a timing chart like that of FIG. 6. FIG. 9 differs from the bias arrangement of FIG. 6 in that the voltage 900 applied on the word lines WLs ($V_{WL}$), is reduced compared to a pass voltage applied during a read operation on a word line.

Figure 10:
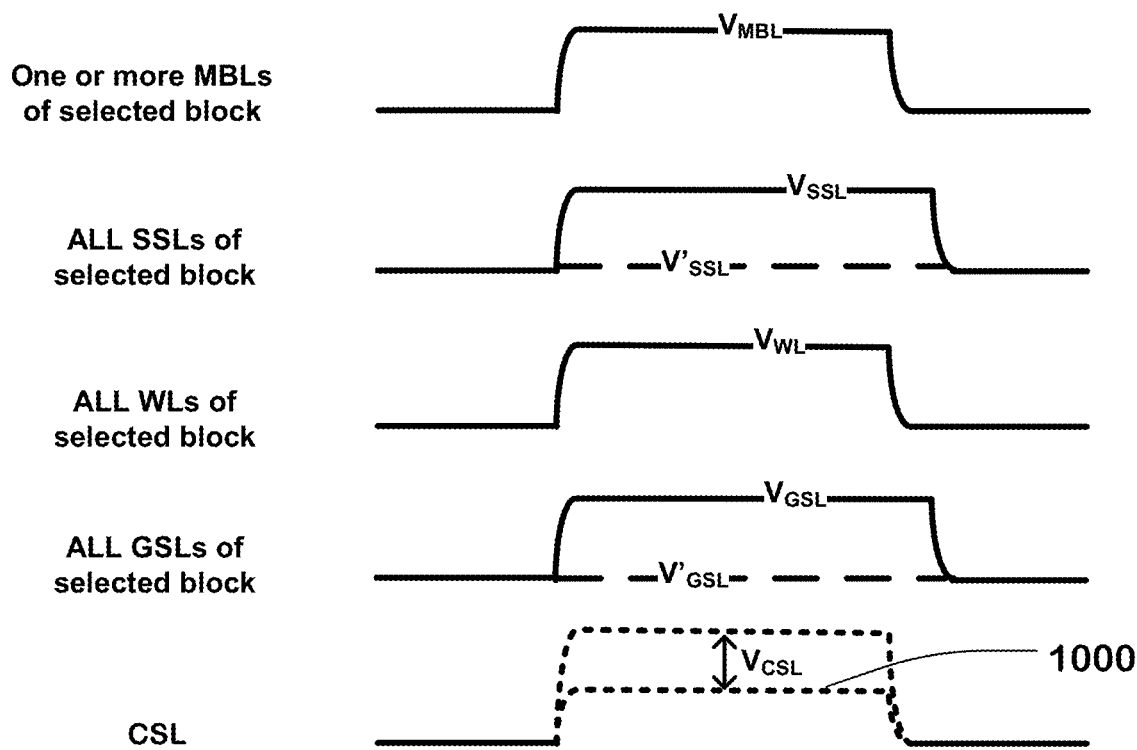
FIG. 10 is a timing diagram of more alternative read setup bias arrangements for embodiments described herein.

FIG. 10 is a timing chart like that of FIG. 6. FIG. 10 differs from the bias arrangement of FIG. 6 in that the voltage on the common source line can be tuned (as indicated at 1000) to set a magnitude of the voltage drop across the NAND string, relative to the corresponding global bit line so that it is different from, and in some embodiments reduced relative to, the voltage drop applied during a read operation.

Figure 11:
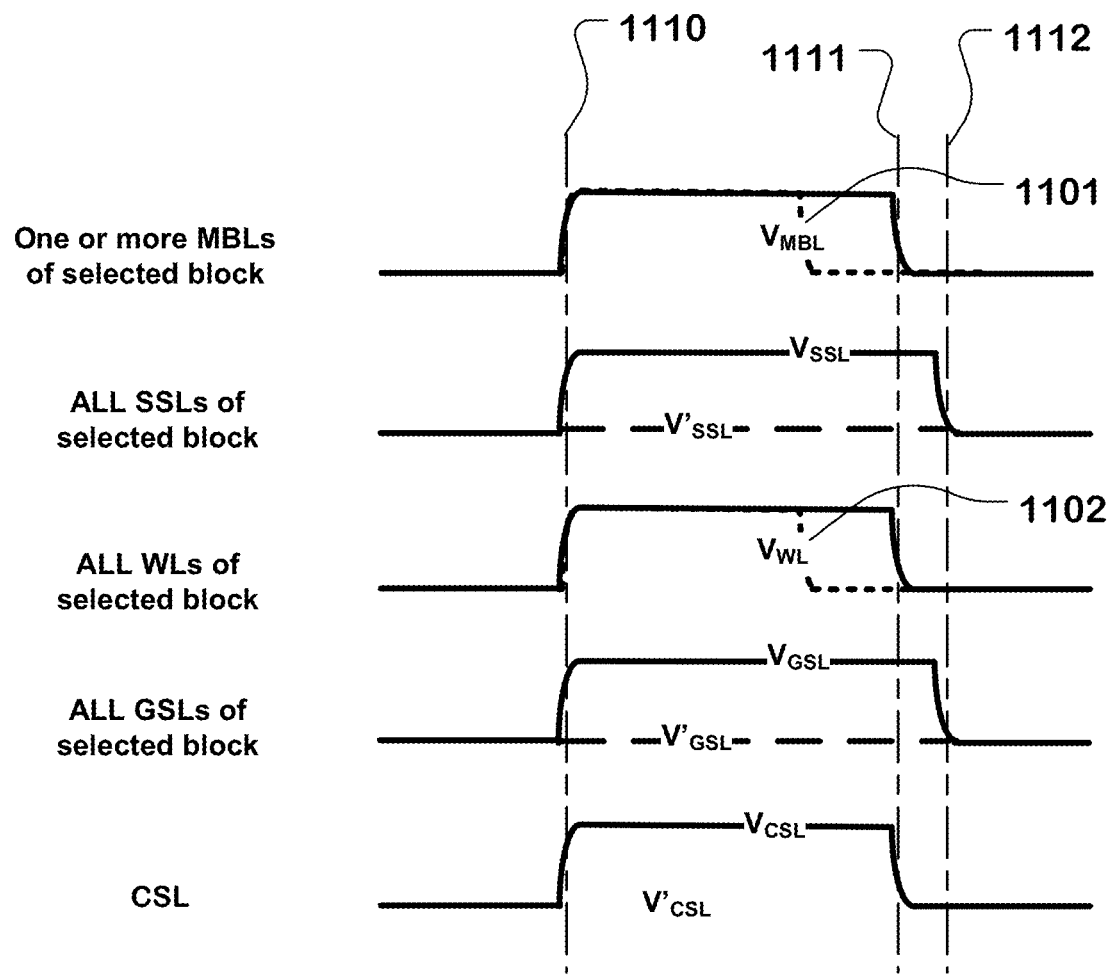
FIG. 11 is a timing diagram of yet more alternative read setup bias arrangements for embodiments described herein.

FIG. 11 is a timing chart like that of FIG. 6. FIG. 11 differs from the bias arrangement of FIG. 6 in that the voltages applied on the bit lines MBLs ($V_{MBL}$) and the voltages applied on the word lines WLs ($V_{WL}$) have reduced duration as indicated at 1101 and 1102, respectively. Otherwise, the control signals have timing characteristics as indicated at 1110, 1111, 1112 as discussed with reference to FIG. 6.

Figure 12:
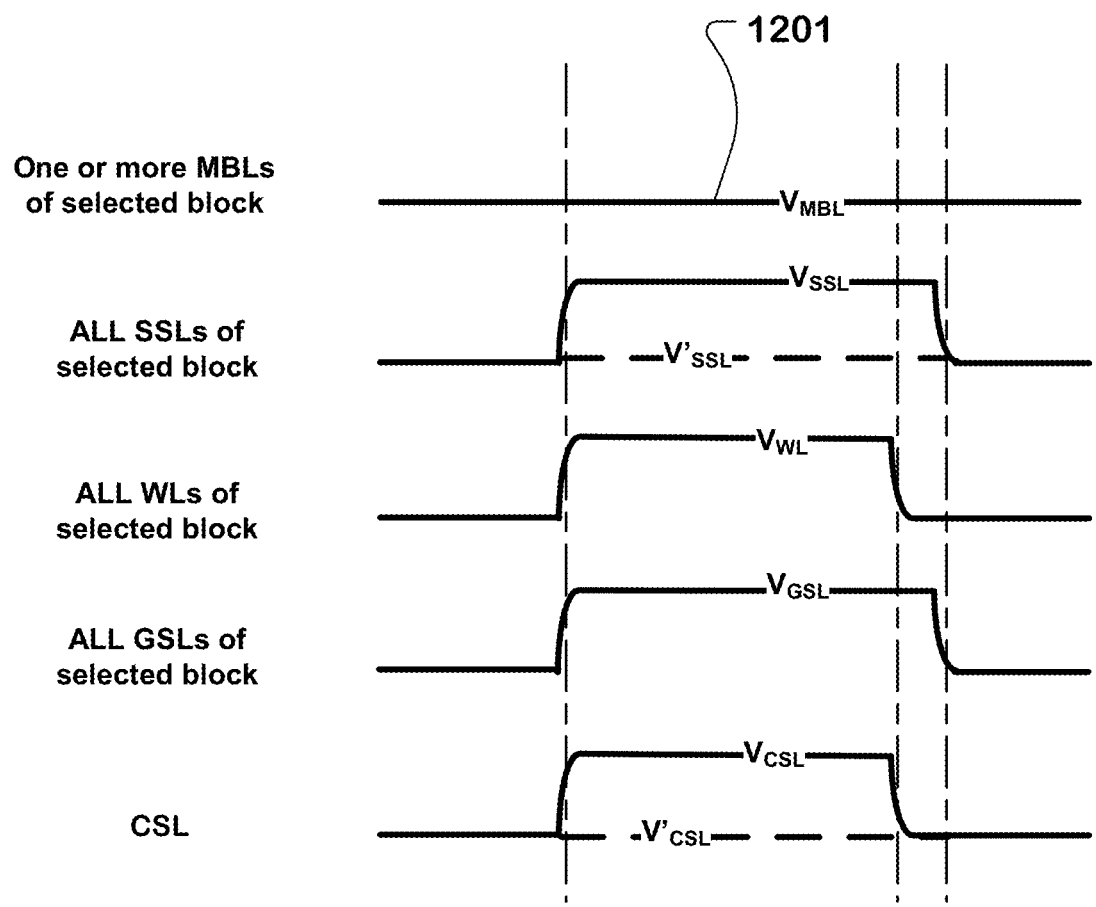
FIG. 12 is another timing diagram of yet more alternative read setup bias arrangements for embodiments described herein.

FIG. 12 is a timing chart like that of FIG. 6. FIG. 12 differs from the bias arrangement of FIG. 6 in that the voltage 1201 applied on the bit lines MBLs ($V_{MBL}$) is maintained at ground voltage. Otherwise, the control signals have timing characteristics as discussed with reference to FIG. 6.

While in some technologies, a read setup operation can be executed by performing a normal read operation of the memory cells within a specified period of time prior to the instant read operation, in technology described herein a setup read operation can be applied to traverse an entire memory array comprising one or more planes on a single chip in a systematic or periodic fashion. In the techniques applied herein, multiple NAND strings coupled to a single bit line can be turned on simultaneously contributing to increased current on the bit lines. Bias arrangements can be applied to reduce the peak current on the bit lines during the read setup operation as described herein. Thus, a read setup operation can have a lower drain side bias than a normal read. Also, a read setup operation can have a lower word line bias than a normal read. Also, a read setup bias operation can have a higher common source line bias than a normal read. Also, a read setup operation can have shorter word line and global bit line setup times to speed up the read setup operation.

Figure 13:
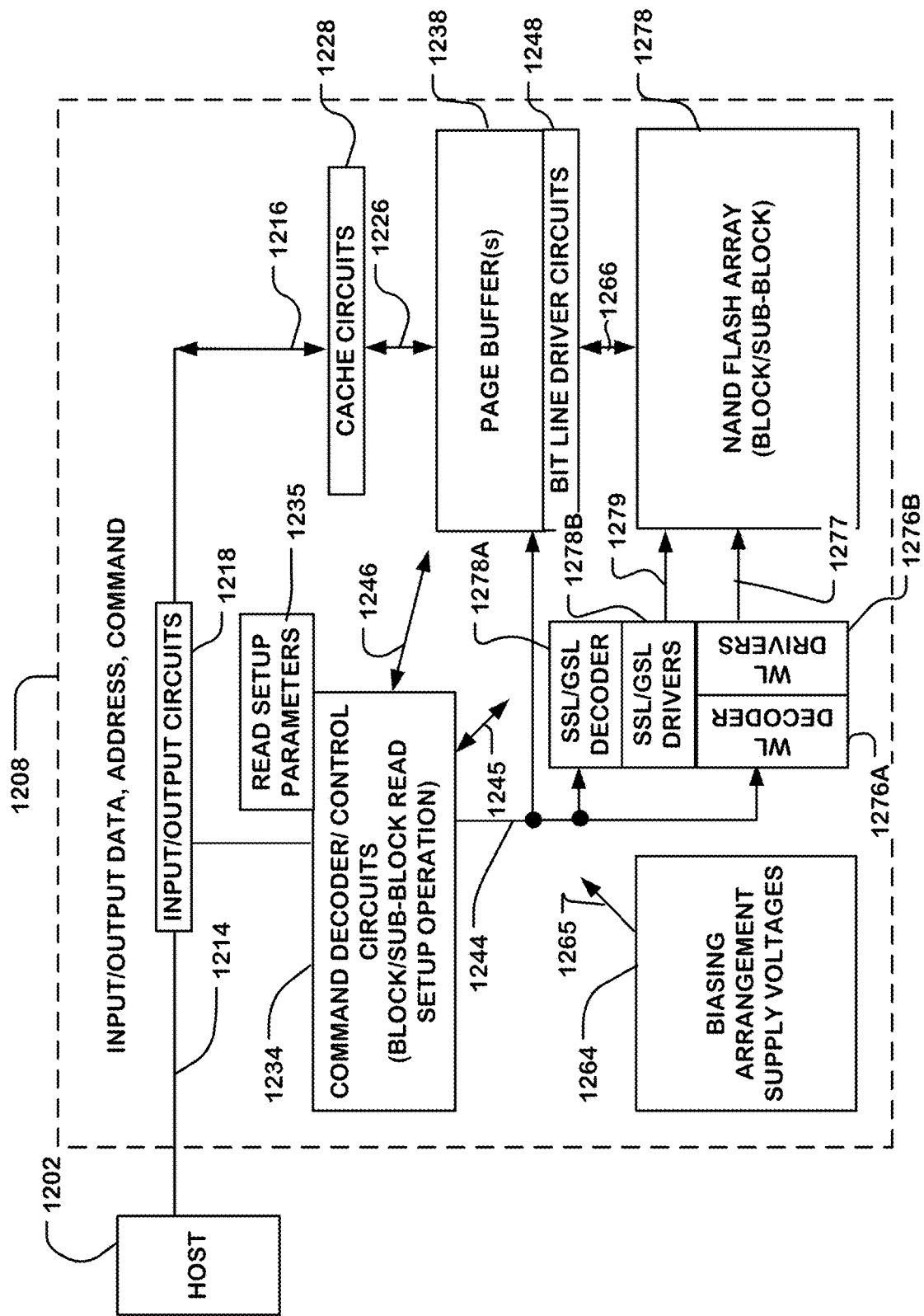
FIG. 13 is a block diagram of a memory system as described herein.

FIG. 13 is a simplified diagram of a memory system including a flash memory device 1208 implemented on an integrated circuit and a host 1202 including logic for issuing commands such as read commands, and program commands with addresses and data to be programmed. In some embodiments, the host can issue read setup commands to initiate read setup operations on the memory device 1208. The memory device 1208 can be implemented on a single integrated circuit chip, on a multichip module, or on a plurality of chips configured as suits a particular need.

The memory device 1208 in this example includes a memory array 1278 including a plurality of blocks as described above, each having a plurality of sub-blocks, on an integrated circuit substrate. The memory array 1278 can be a NAND flash memory implemented using two-dimensional or three-dimensional array technology.

In various embodiments, the memory device 1208 may have single-level cells (SLC), or multiple-level cells storing more than one bit per cell (e.g., MLC, TLC or XLC).

The memory device 1208 includes a memory array 1278, which can be a NAND flash memory implemented using three-dimensional array technology having one or multiple planes, each plane having multiple blocks, and each block having multiple sub-blocks.

A word line decoder 1276A is coupled via word line driver circuits 1276B to a plurality of word lines 1277 in the memory array 1278. SSL/GSL decoder 1278A is coupled via SSL/GSL driver circuits 1278B by SSL and GSL lines 1279, to bit line side (SSL) and common source side (GSL) string select gates in the array. Page buffer circuits 1238 are coupled by bit line driver circuits 1248 to bit lines 1266 in the memory array 1278. In some embodiments, column decoder circuits can be included for routing data from the bit line drivers to selected bit lines. The page buffer circuits 1238 can store pages of data that define a data pattern for a page program operation, and can include sensing circuits used in read and verify operations Bit lines for memory arrays can comprise global bit lines (GBL) and local bit lines. Bit lines generally comprise metal conductors in higher patterned layers that traverse a plurality of blocks of memory cells in an array. The global bit lines are connected to the NAND strings for current flow to and from the bit lines, which in turn are connected to the bit line driver circuits 1248 and page buffer circuits 1238. Likewise, the word lines can include global word lines and local word lines with corresponding supporting circuits 1276B in the word line drivers.

In a sensing operation, sensed data from the page buffer circuits 1238 are supplied via second data lines in bus system 1226 to cache circuits 1228, which are in turn coupled to input/output circuits 1218 via data path links 1216. Also, input data is applied in this example to the cache circuits 1228 on links 1216, and to the page buffer circuits 1238 on bus system 1226, for use in support of program operations.

Input/output circuits 1218 are connected by link 1214 (including I/O pads) and provide communication paths for the data, addresses and commands with destinations external to the memory device 1208, including the host 1202 in this example. The input/output circuits 1218 provide a communication path by link 1216 to cache circuits 1228 which support memory operations. The cache circuits 1228 are in data flow communication (using for example a bus system 1226) with page buffer circuits 1238.

Control circuits 1234 are connected to the input/output circuits 1218, and include command decoder logic, address counters, state machines, timing circuits and other logic circuits that control various memory operations, including program, read, and erase operations for the memory array 1278. Control circuit signals are distributed to circuits in the memory device, as shown by arrows 1245, 1246, as required to support the operations of the circuits. The control circuits 1234 can include address registers and the like for delivery of addresses as necessary to the components of the memory device 1208, including delivery to the cache circuits 1228 and, on link 1244, to the page buffer circuits 1238, word line decoder 1276A and SSL/GSL decoder 1278A in this illustration.

In the example shown in FIG. 13, control circuits 1234 include control logic circuits that include modules implementing a bias arrangement state machine, or machines, which controls, or control, the application of bias voltages generated or provided through the voltage supply or supplies in block 1264, including read setup, read, erase, verify and program voltages including precharge voltages, pass voltages and other bias voltages as described herein to word line driver circuits 1276B and bit line driver circuits 1248, for a set of selectable program, read setup and read operations. Bias voltages are applied as represented by arrow 1265, to components of the memory device 1208, as necessary for support of the operations.

The control circuits 1234 can include modules implemented using special-purpose logic circuitry including state machines, as known in the art. In alternative embodiments, the control circuits 1234 can include modules implemented using a general-purpose processor, which can be implemented on the same integrated circuit, which execute a computer program to control the operations of the memory device 1208. In yet other embodiments, a combination of special-purpose logic circuitry and a general-purpose processor can be utilized for implementation of modules in control circuits 1234.

The flash memory array 1278 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 1202 is coupled to links 1214 on the memory device 1208, as well as other control terminals not shown, such as chip select terminals and so on, and can provide commands or instructions to the memory device 1208. In some examples, the host 1202 can be coupled to the memory device using a serial bus technology, using shared address and data lines. The host 1202 can comprise a general purpose processor, a special purpose processor, a processor configured as a memory controller, or other processor that uses the memory device 1208. All or part of the host 1202 can be implemented on the same integrated circuit as the memory.

The host 1202 can include a file system or file systems that store, retrieve, and update data stored in the memory based on requests from an application program. In general, the host 1202 can include programs that perform memory management functions including, in some embodiments, functions to control or support read setup operations as described here. Other memory management functions can include, for example, wear leveling, bad block recovery, power loss recovery, garbage collection, error correction, and so on. Also, the host 1202 can include application programs, file systems, flash translation layer programs and other components that can produce status information for data stored in the memory, including issuing commands to program data having addresses and data to be programmed.

In the example illustrated in FIG. 13, the memory device includes a set of status registers 1235 to store parameters for read setup operations. The parameters can define the voltage levels to be applied, whether to turn on or off the string select and ground select gates, pulse durations and so on, as discussed with reference to FIGS. 6 to 11. Also, the parameters can include a starting plane and block address and a range of block addresses (or addresses of other read setup units) to be subject of a particular read setup operation. The parameters can include indicators for planes, and blocks within planes, and sub-blocks within blocks to be activated simultaneously for read setup operations. Some or all of parameters can be provided by read setup commands, and some or all can be stored as configuration data on the chip.

A state machine on the memory device can access the read setup parameters, and execute a read setup operation including address generation and applying bias voltages to traverse the memory array to maintain read ready status across the memory. The operation can include a starting block and ending block. The operation can include a pattern of blocks in one plane or in multiple planes that can be subjected to the read setup operation simultaneously. The operation can be configured to traverse the array or parts of the array as a background operation, without external control. The operation can be configured to operate in response to read setup commands, carrying the read setup parameters and identifying segments of the array to be operated on by the read setup operation. The read setup commands can be generated by a memory controller in the host for example, which monitors block status, such as by identifying cold blocks in a wear leveling operation as stale blocks, and can send commands identifying stale blocks, or can send commands during time intervals in which the memory array is idle or expected to be idle. The state machine can set a ready/busy pin on the memory device to signal the control program on the memory controller for coordination of the read setup operations.

Figure 14:
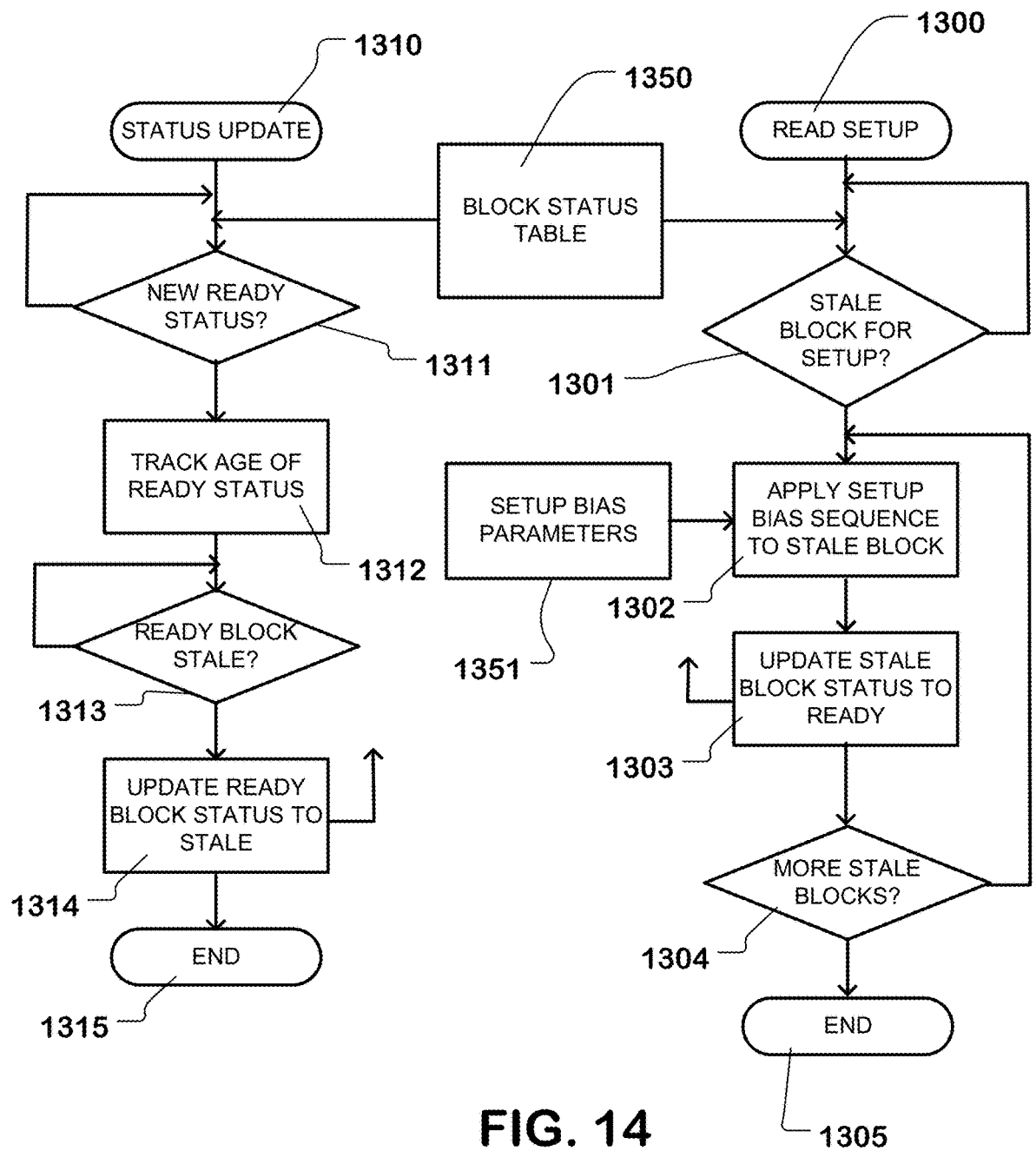
FIG. 14 is a flow chart of read setup operations as described herein.

FIG. 14 is a flowchart for a representative method of operating a NAND memory including a plurality of blocks of memory cells arranged in NAND strings, each block including a distinct set of NAND strings. As described above, each block can include a plurality of sub-blocks, each sub-block including a distinct subset of NAND strings.

In FIG. 14, a read setup operation begins as indicated at 1300. The operation first identifies a stale block as the subject of the read setup operation (1301). The operation can identify stale blocks by accessing a block status table 1350, which indicates a status of the blocks in the memory as stale, meaning that they are flagged for a read setup operation, or ready meaning that they can be read without requiring a read setup operation. Also, the operation can identify stale blocks as parameters carried in a read setup command received from an external controller. If there are no stale blocks available for read setup, the algorithm loops to wait for an indication of the stale block, or the algorithm can terminate and restart after a pre-determined interval. Next, for an identified stale block, a read setup bias sequence is applied (1302). The read setup bias sequence can be configured in response to read setup bias parameters stored in status registers 1351. After applying a read setup bias sequence to a stale block, the block status table 1350 is updated to indicate that the block is ready (1303). Next, the operation determines whether there are more stale blocks (1304). If not, the algorithm ends at 1305. If there are more stale blocks at 1304, the algorithm loops back to block 1302 to continue applying read setup bias sequences to the stale blocks.

A controller managing the read setup operation can also execute a status update operation 1310. The status update operation can monitor the block status table 1350, to identify blocks that have been newly set as ready (1311). If a newly set ready block is identified, then the operation begins tracking the age of the ready status for the block (1312). If the ready block becomes stale (1313), such as by having set a ready status, such as by having been read or having been subject of a read setup operation, having an age longer than a specific duration (e.g. 10 minutes), then the controller can update the ready block status to stale in the block status table 1350 (1314). After updating the status, then the operation is finished as to the new ready status block. This cycle of steps 1310 to 1315 can be executed in parallel for all the blocks in the block status table. In alternative systems, all the blocks in the system are traversed and updated from the ready to stale status periodically so that the read setup operation is applied systematically across the array, without requiring monitoring of the read status of each block separately. In some embodiments, a block status table indicating stale blocks is not required, but rather status in maintained on chip or in a host, indicating an order in the systematic traversal of the array independent of read commands.

FIG. 14 is one example of an operating method that includes traversing the plurality of blocks to apply read setup bias arrangements to stale blocks in the plurality of blocks which condition the stale blocks for read operations, where the read setup bias arrangements include simultaneously applying a read setup bias to a plurality of memory cells of a selected block of the plurality of blocks.

Also, FIG. 14 is one example of an operating method that can operate independently of read commands, such as in the background.

Figure 15:
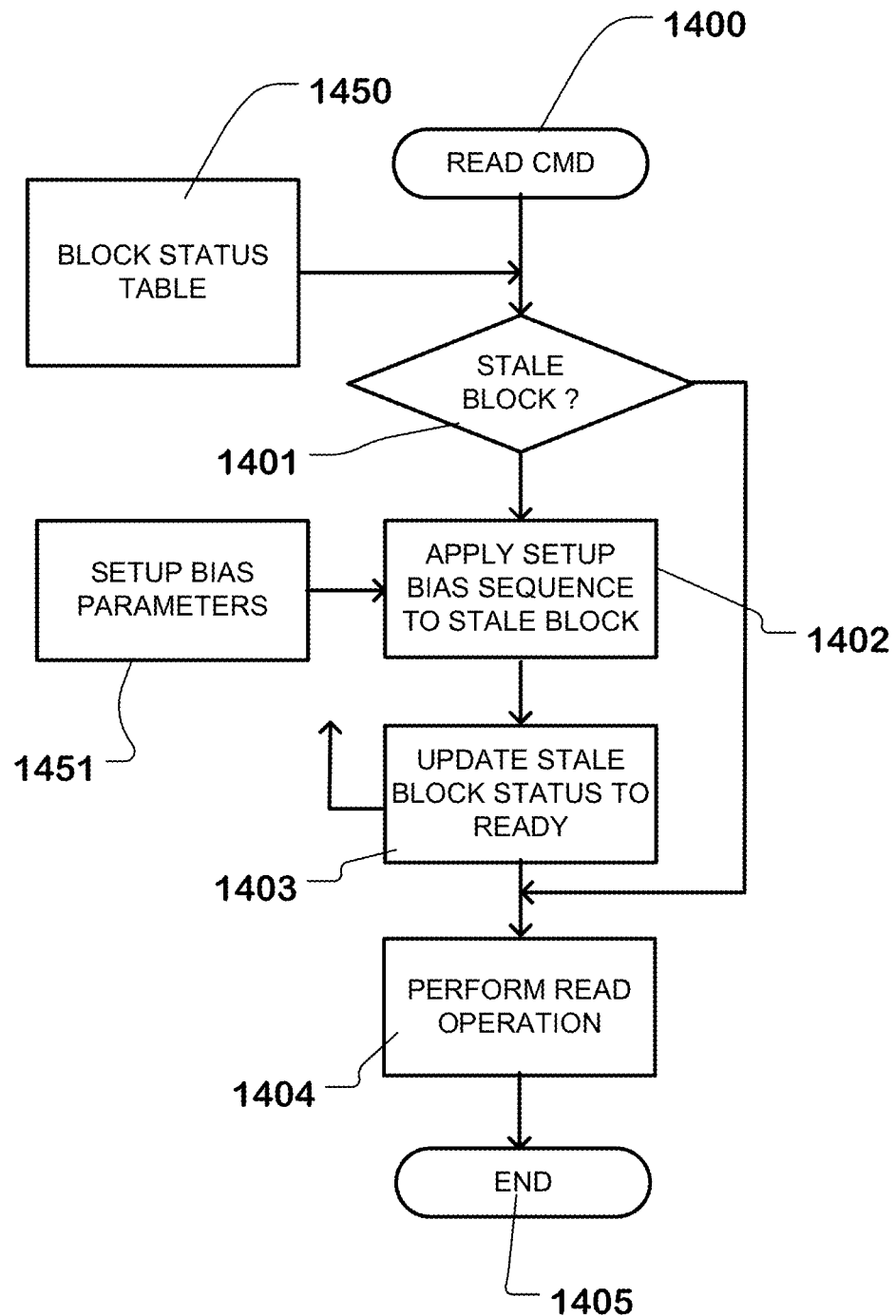
FIG. 15 is a flow chart of a read operation with read setup operations for stale blocks.

FIG. 15 illustrates a read operation for a system like that described herein. In the method of FIG. 15, a read command is received to initiate the read operation at 1400. The algorithm determines whether the read is directed to a stale block by, for example, accessing a block status table 1450 (1401). If not, then the read operation can proceed to perform the read subject of the command (1404). If the block is a stale block at 1401, then the read operation causes execution of a read setup bias sequence to the stale block (1402), applying bias voltages having parameters set by the setup bias parameters 1451. After applying the read setup bias sequence, the status of the block is updated in the block status table 1450 (1403). Also, the read subject of the command is performed (1404). After performing read subject of the command, the operation is terminated (1405).

FIGS. 14 and 15 are examples of operations that can be utilized to perform read setup procedures as described herein, that apply bias arrangements in parallel or simultaneously to a plurality of memory cells, such as to multiple memory cells coupled to a single bit line, to all the memory cells in a sub-block, to all the memory cells in a block, to all the memory cells in multiple sub-blocks, or to all the memory cells in multiple blocks.

FIGS. 14 and 15 are flowcharts illustrating logic executed by a memory controller or by a memory device. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

A technology is described herein that can execute read setup operations at high speed, and more often than available in prior technologies, thereby improving the memory cell operation window by maintaining the memory cells in condition for having thresholds as set during the program operation. These technologies are particularly beneficial in large high density memory systems. For example, if there are multiple sub-blocks in one block, all the sub-blocks of one block can be subject of the read setup operation simultaneously to improve the speed of the operation. Also, if there are multiple blocks in one memory plane, multiple blocks can be subject of the read setup operation simultaneously to improve the speed of the operation. Also, if there are multiple planes in one memory device, the read setup operation can be applied simultaneously to blocks or sub-blocks in the multiple planes to improve the speed of the operation.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory, comprising:
a memory array, comprising a plurality of planes, each plane in the plurality of planes comprising a plurality of blocks, wherein blocks in the plurality of blocks are arranged to be activated for memory operations in response to corresponding groups of word lines; and
control circuits comprising logic to execute read setup operations in respective selected blocks in more than one plane of the plurality of planes simultaneously, wherein each of the read setup operations comprises simultaneously applying a read setup bias to a respective plurality of memory cells of a selected block of the plurality of blocks in respective planes of the plurality of planes.

2. The memory of claim 1, including logic to traverse the blocks in the plurality of blocks in a plane of the plurality of planes to apply a read setup operation, of the read setup operations, to the plurality of blocks.

3. The memory of claim 1, wherein the blocks in the plurality of blocks in a plane of the plurality of planes include, respectively, a plurality of sub-blocks, wherein sub-blocks in the plurality of sub-blocks are arranged to be activated for connection to a set of global bit lines for memory operations in response to corresponding sub-block string select lines, and a sub-block comprises a plurality of NAND strings, and a read setup operation, of the read setup operations, includes traversing the sub-blocks in the selected block, to simultaneously apply the read setup bias to respective pluralities of memory cells of individual sub-blocks of the selected block.

4. The memory of claim 1, wherein the blocks in the plurality of blocks in a plane of the plurality of planes comprise a plurality of sub-blocks, and a read setup operation, of the read setup operations, includes traversing the sub-blocks in the selected block, to simultaneously apply the read setup bias to respective pluralities of memory cells in more than one sub-block of the plurality of sub-blocks of the selected block.

5. The memory of claim 1, wherein the memory array comprises NAND strings of charge trapping memory cells having thin film channels, and the read setup bias conditions the thin film channels for a subsequent read operation.

6. The memory of claim 1, including a block status table to store a read setup status for corresponding blocks, including a stale block status and a ready block status, and logic to initiate a read setup operation, of the read setup operations, for blocks, in a plane of the plurality of planes, having a stale block status, and to update the block status table in dependence on the read setup operation.

7. The memory of claim 1,
wherein a plane in the plurality of planes comprises said plurality of blocks of memory cells and a plurality of bit lines, each block including a set of NAND strings having string select gates for connection to corresponding bit lines in the plurality of bit lines, and in which each NAND string in the set of NAND strings of the block is connected to the group of word lines;
wherein each block in the plurality of blocks of memory cells of the plane includes a plurality of sub-blocks, each sub-block including a distinct subset of the set of NAND strings of the block, the distinct subset of NAND strings in each sub-block being operatively connected to a respective sub-block string select line by which gate voltages are applied to the string select gates of the NAND strings in the distinct subset of the sub-block; and
wherein the read setup bias comprises a bias arrangement comprising bias voltages on at least one sub-block string select line in a selected block, and on the word lines in the group of word lines of the selected block.

8. The memory of claim 7, wherein the bias arrangement comprises bias voltages on the word lines in the group which are lower than pass voltages applied in a read operation.

9. The memory of claim 7, wherein the bias arrangement comprises bias voltages on the word lines in the group which have shorter duration than pass voltages applied in a read operation.

10. The memory of claim 7, wherein the bias arrangement comprises bias voltages on at least one sub-block string select line in a selected block which have shorter duration than sub-block string select line voltages applied in a read operation.

11. The memory of claim 7, wherein the bias arrangement comprises bias voltages on the plurality of bit lines and on a common source line for the selected block.

12. The memory of claim 11, wherein the bias arrangement comprises bias voltages on the plurality of bit lines for the selected block which are lower than bit line voltages applied in a read operation.

13. The memory of claim 7, wherein the bias arrangement comprises bias voltages on the plurality of bit lines and on a common source line for a selected sub-block, wherein the voltage applied on the common source line is set to reduce a difference in voltage between the common source line and the corresponding bit lines relative to a difference in voltage applied in a read operation in the NAND strings of the selected sub-block.

14. A method of operating a memory comprising a NAND array having a plurality of memory planes, each memory plane in the plurality of memory planes including a plurality of blocks of memory cells and a plurality of bit lines, each block including a set of NAND strings having string select gates for connection to corresponding bit lines in the plurality of bit lines, and in which each NAND string in the set of NAND strings of the block is connected to a group of word lines for the block, the method comprising:
traversing the plurality of blocks in more than one memory plane of the plurality of memory planes to simultaneously apply read setup bias arrangements to stale blocks in the plurality of blocks which condition the stale blocks for read operations,
wherein the read setup bias arrangements include simultaneously applying a read setup bias to a respective plurality of memory cells of a selected block of the plurality of blocks in respective memory planes in the plurality of memory planes.

15. The method of claim 14, including maintaining a block status table identifying stale blocks.

16. The method of claim 14, wherein each block in the plurality of blocks of memory cells in a memory plane of the plurality of memory planes includes a plurality of sub-blocks, each sub-block including a distinct subset of the set of NAND strings of the block, the distinct subset of NAND strings in each sub-block being operatively connected to a respective sub-block string select line by which gate voltages are applied to the string select gates of the NAND strings in the distinct subset of the sub-block, and wherein the read setup bias arrangements are applied to more than one sub-block simultaneously.

* * * * *